United States Patent [19]

Pawlik

[11] Patent Number: 4,795,976

[45] Date of Patent: Jan. 3, 1989

[54] APPARATUS AND DERIVATIVE TECHNIQUE FOR TESTING DEVICES

[75] Inventor: Jonathan R. Pawlik, New Providence, N.J.

[73] Assignee: American Telephone and Telegraph Company AT&T Bell Laboratories, Murray Hill, N.J.

[21] Appl. No.: 4,166

[22] Filed: Jan. 15, 1987

[51] Int. Cl.$^4$ .......................................... G01R 31/26
[52] U.S. Cl. ........................... 324/158 D; 324/158 R; 324/73 R
[58] Field of Search ............ 324/158 R, 158 D, 73 R; 371/25; 364/481, 483, 486, 570; 356/72

[56] References Cited

U.S. PATENT DOCUMENTS

| | | | |
|---|---|---|---|
| 4,062,632 | 12/1977 | Dixon | 356/72 |
| 4,106,096 | 8/1978 | Paoli | 324/158 D X |
| 4,680,810 | 7/1987 | Swartz | 324/158 D X |
| 4,689,555 | 8/1987 | Brust et al. | 324/158 R |

*Primary Examiner*—Ernest F. Karlsen
*Assistant Examiner*—Vinh P. Nguyen
*Attorney, Agent, or Firm*—Michael J. Urbano

[57] ABSTRACT

Devices having nonlinearities in their electrical/optical output characteristics are identified, and the location and magnitude of the nonlinearities are quantified, by a technique which includes generating an estimated first derivative of the device output response which would be obtained if the device had no nonlinearities, comparing the measured and estimated functions to generate a deviation function, and comparing the deviation function to a predetermined criterion in order to identify which devices have undesirable nonlinearities. The specific application of this technique to the identification and quantification of kinks and light jumps in semiconductor lasers is described.

14 Claims, 4 Drawing Sheets

APPARATUS AND DERIVATIVE TECHNIQUE FOR TESTING DEVICES

BACKGROUND OF THE INVENTION

This invention relates to the testing of devices; in particular, electrical, optical or electro-optical devices.

In the manufacture of electrical, optical and electro-optical devices it is common to subject hundreds and even thousands of devices to various time consuming and expensive tests in order to determine which ones meet predetermined specifications. The tests often include measurement of device output (e.g., voltage V or light power L) as a function of input excitation supplied, for example, in the form of input current (I). The relationships between the device inputs and outputs define functional characteristics (e.g., L-I curves or V-I curves) which themselves provide information about device performance. Take the case of a semiconductor laser for example. The L-I curve above threshold is preferably linear and has a slope equal to the differential quantum efficiency of the laser. However, certain well-known nonlinearities in the L-I curve, kinks and light jumps, are evidence that the laser will introduce noise and hence may not meet system specifications. To determine whether a laser exhibits an undesirable nonlinearity, and to quantify that nonlinearity, is no trivial task. While a few nonlinearities may be large enough to be apparent from a visual inspection of the L-I curve itself (FIG. 1), others (FIGS. 2–6) are not so self evident. In order to alleviate this problem, workers in the art have resorted to inspection of derivatives of the L-I curve becuase the derivative curves tend to emphasize deviations at the location of the nonlinearity. For example, the L-I curve of FIG. 4 contains little or no visual evidence that the laser has a kink, but the first derivative curve $(dL/dI)_{act}$ has a large dip in the range 55–80 mA which clearly suggests the presence of one. To determine whether an undesirable kink is actually present requires that the derivative curve be compared with some reference, criterion or specification. This comparison requires that the size and location in current of the kink be quantified. Not all lasers, however, have derivative curves which exhibit kinks as clearly as FIG. 4, and even in those which do, it is still a difficult task for a test set operator to judge whether the specification is met or not.

Thus, there is a need for a technique which not only enables the accurate identification and quantification of nonlinearities in lasers and other devices, but also allows the determination to be performed rapidly so as to reduce testing time and expense.

SUMMARY OF THE INVENTION

In accordance with one aspect of the invention, devices having nonlinearities in their output characteristics are identified, and the location and magnitude of the nonlinearities are quantified, by a technique which includes the steps of: (1) providing excitation to the device, (2) detecting the response of the device to the excitation, (3) measuring the first derivative function of the response with respect to the excitation, (4) generating an estimated first derivative function which would be obtained if the device had no nonlinearities, (5) comparing the measured and estimated functions to generate a deviation function, and (6) comparing the deviation function to a predetermined criterion in order to identify which devices have undesirable nonlinearities.

A significant aspect of the invention resides in the ability to perform the identification and quantification electronically, without the need for human operator screening. Removal of human judgment from the decision process significantly increases accuracy and can often lead to the elimination of other tests (e.g., noise spectra and bit-error-rate tests) which are used, in part, to compensate for imperfect human judgment.

In a preferred embodiment, which is especially suitable for detecting kinks and light jumps in semiconductor lasers, the estimated first derivative function is generated by a binary weighted polynomial fit to the measured first derivative function $dL/dI$, and the weighting function of the polynomial is obtained by (1) applying adaptive discriminator levels to the second and third derivative functions $d^2L/dI^2$ and $d^3L/dI^3$ to identify regions of deviation in the first derivative, and (2) processing the result using a pattern recognition technique to delete from the weighting function anomalies which occur where the magnitude of higher order derivatives is small in the region of deviation.

BRIEF DESCRIPTION OF THE DRAWING

The invention, together with its various features and advantages, can be readily understood from the following, more detailed description taken in conjunction with the accompanying drawing, in which.

DETAILED DESCRIPTION

Figure 7:
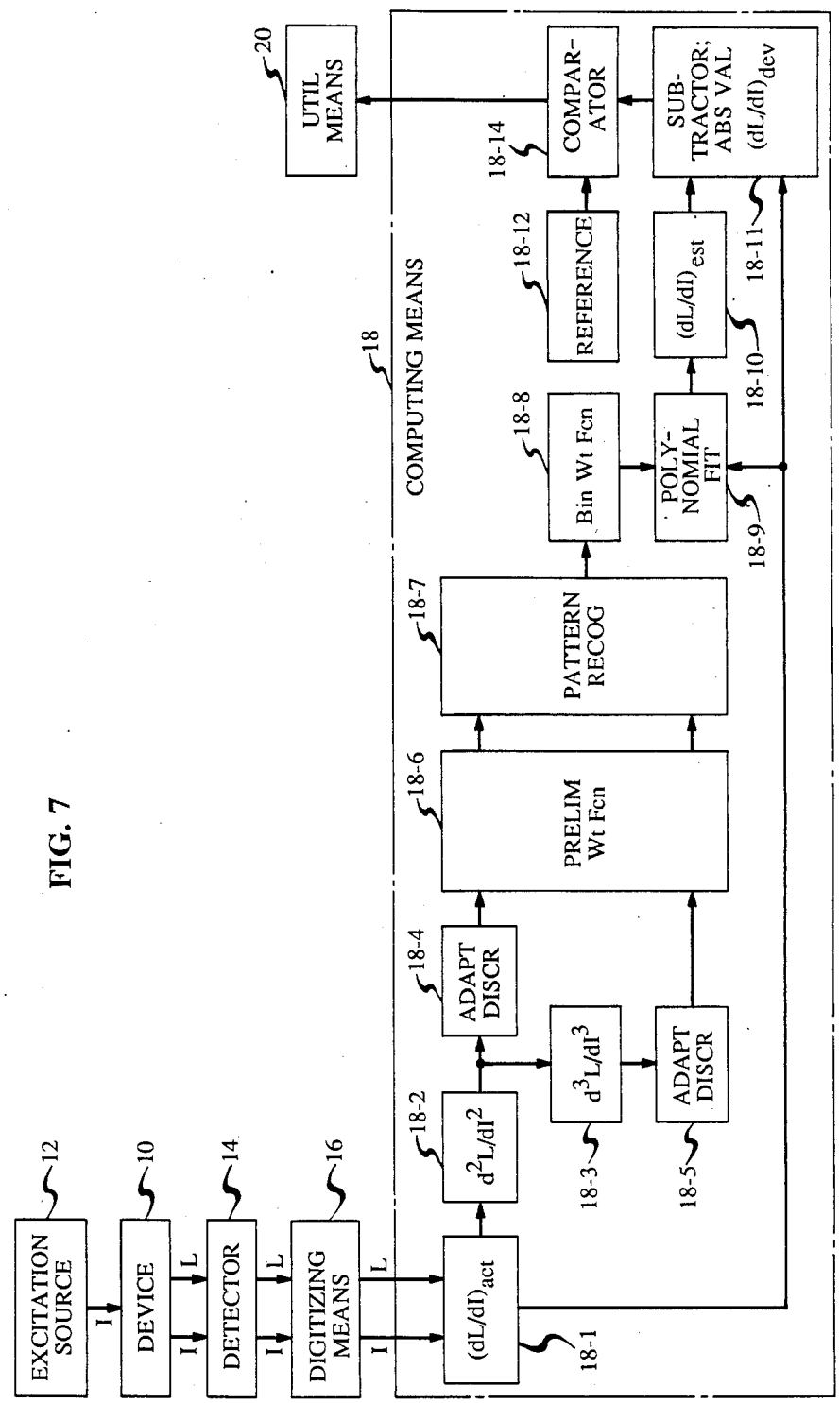
FIG. 7 is a block diagram of testing apparatus in accordance with one embodiment of the invention.

Turning first to FIG. 7, there is shown apparatus for determining whether a device exhibits a nonlinearity in its output characteristic. For the purposes of exposition only, the following description will be directed to semiconductor lasers. However, it will be understood that the principles of the invention apply as well as to other devices such as light emitting diodes and photodiodes. Thus, device 10 is a semiconductor junction laser and excitation source 12 is a current source for driving the laser. Source 12 may supply either dc or pulsed excitation. As the laser emits light, and both the light (L) and the current (I) are measured by detector means 14. The analog forms of the light and current signals are converted to digital signals by digitizing means 16 which supplies the digitized L-I inputs to computing means 18. The L-I inputs are stored as data in computing means 18 where later they are electronically manipulated.

The computing means 18 performs a variety of manipulations of the light and current data. For example, it utilizes well known numerical techniques in order to generate an actual first derivative function $(dL/dI)_{act}$ and various derivatives thereof. In addition, computing means 18 utilizes techniques in accordance with the invention to generate an estimated first derivative $(dL/dI)_{est}$ which would be obtained if the laser had no kinks, light jumps or other substantial nonlinearities. Further in accordance with the invention, computing means 18 compares the actual and estimated functions to generate a deviation function $(dL/dI)_{dev}$ which is representative of the location and size of the nonlinearities in the L-I curve. Lastly, computing means 18 compares the deviation function to a predetermined reference criterion in order to identify which lasers have undesirable nonlinearities.

Identification and quantification of nonlinearities in lasers is realized by the apparatus of FIG. 7, without the need for human operator screening, in accordance with one aspect of the invention in which, for each device tested, $(dL/dI)_{est}$ is generated by a binary weighted polynominal fit to $(dL/dI)_{act}$, and the weighting function of the polynomial is obtained by (1) applying adaptive discriminator levels to the second and third derivatives of $d^2L/dI^2$ and $d^3L/dI^3$ to identify regions of deviation in $(dL/dI)_{act}$ and (2) processing the result utilizing a pattern recognition technique to delete from the weighting function localized anomalies which occur where the magnitudes of higher order L-I derivatives are small in the region of deviation.

More specifically, the L-I outputs from the digitizing means 16 are stored as data in computing means 18. Derivative means 18.1 utilizes well-known numerical techniques to generate the actual first derivative $(dL/dI)_{act}$. Similarly, derivative means 18.2 generates the second derivative $d^2L/dI^2$ from the first derivative and supplies the result to both adaptive discriminator means 18.4 and derivative means 18.3 which generates the third derivative $d^3L/dI^3$. The latter is supplied to adaptive discriminator means 18.5. The outputs of the two discriminator means are supplied to weighting means 18.6 which generates a preliminary weighting function, which equals zero in the region where a nonlinearity is located, except for one or more isolated anomalous points, if any, where the preliminary weighting function (e.g., see FIGS. 3 and 5) equals one in that region. Since such anomalous points have been shown (FIG. 3) to adversely affect the quality of the polynomial fit, the preliminary weighting function is supplied to pattern recognition means 18.7 which eliminates the anomalous points, resulting in the desired binary weighting function stored in memory means 18.8. Then, the binary weighting function and the actual first derivative are supplied to fit means 18.9 which performs the polynomial fit utilizing, for example, Legendre-like polynomials in order to generate the estimated first derivative $(dL/dI)_{est}$ which is stored in memory means 18.10. The deviation function $(dL/dI)_{dev}$ is generated by subtractor means 18.11 by supplying thereto the actual first derivative from means 18.1 and the estimated first derivative from means 18.10, essentially subtracting the latter from the former, taking the absolute value of the difference, and then normalizing with respect to the peak of $(dL/dI)_{est}$. The resulting deviation function and a predetermined reference criterion, which is stored in memory means 18.12, are compared in comparator means 18.14 to generate an output which drives utilization means 20 (e.g., a graphics printer). The output indicates whether or not the laser under test has a nonlinearity which meets or exceeds the predetermined criterion (e.g., device or system specification).

EXAMPLE I

This example describes the apparatus and derivative technique utilized to identify and quantify kinks and light jumps in long wavelength InP/InGaAsP semiconductor diode lasers. The various types of equipment, analytical techniques, device parameters and materials, etc., are provided by way of illustration only and, unless otherwise indicated, are not intended to limit the scope of the invention.

Thus, excitation source 12 comprised a commercially available pulse generator capable of supplying current pulses in several hundred current increments over a range of about 200 mA. Detector means 14 included a long wavelength Ge photodiode which converted the light output of the laser to a photocurrent proportional to the light intensity L. The current I flowing through the laser and the photocurrent were both converted to digital form in digitizing means 16 which included an amplifier to amplifying the photocurrent of the Ge photodiode and applying it to a sample-and-hold circuit. The output of the latter was supplied to the input of an HP 3456A digital voltmeter. Detector means 14 also included a current transformer which was used in conjunction with similar circuitry to digitize the current flowing through the laser. Computing means 18 comprised a Hewlett-Packard 9836CU computer programmed to perform the various functions described above and was able to convert $(dL/dI)_{act}$ data taken at about 200 current increments to decisions on the presence and quantification of a nonlinearity by generating $(dL/dI)_{dev}$ in a time of approximately 2.5 seconds/laser.

The following least squares polynomial fitting technique was employed by computing means 18. Performing a classical least squares, polynomial fit to a discrete function $f_i$ (e.g, the function dL/dI) at abscissa (e.g., current) values $x_i$ poses two computational problems in this application. The fitting of a degree n polynomial to m data points (e.g., the number of increments of current used to generate an L-I curve) requires the inversion of an n+1 by m matrix $d_{ij}$ of the form $$d_{ij} = x_i^j, \text{ where } i=1,\ldots,m \text{ and } j=0,\ldots,n. \quad (1)$$

Then the polynomial fit $f_i$ is given by $$f_i \approx \sum_{j=0}^{n} c_j x_i^j \quad (2)$$

where $x^j$ is known as the basis set and the coefficients $c_j$ are defined by $$c_j = \sum_{i=1}^{m} \bar{d}_{ji} f_i \quad (3)$$

Because the matrix d is frequently ill conditioned, the calculation of the inverted matrix $\bar{d}$ often requires pivoting operations and rapidly becomes inaccurate as n increases. In addition, considerable computation time is involved when $m \approx 200$ and $n \approx 3$. However, in order to operate real time on existing L-I-V test sets, the following least squares polynomial fitting method was employed. The need to invert $d_{ij}$ arises from the fact that the basis set $x^j$, where $j=0,\ldots,n$, is not orthogonal for the interval of $x_i$ abscissa values where $i=1,\ldots,m$. If a set of orthogonal basis functions for the interval could be found, say $\phi_i^{(j)}$, where j denotes the maximum order of each of the basis functions, then the function $f_i$ can be approximated by $$f_i \approx \sum_{j=0}^{n} c_j \phi_i^{(j)}, \quad (4)$$

where the new set of coefficients $c_j$ is defined by $$c_j = \frac{(\phi^{(j)}, f)}{(\phi^{(j)}, \phi^{(j)})} \quad (5)$$

and the inner product is defined in the usual way $$(g,h) = \sum_{i=1}^{m} g_i h_i \quad (6)$$

For example, in the numerator of equation (6), $g=\phi^{(j)}$ and $h=f$. Similarly, for the denominator $g=h=\phi^{(j)}$. Such a set of basis functions was constructed as follows $$\phi_i^{(0)} = 1, \quad (7)$$

$$\phi_i^{(1)} = x_i - \frac{(x\phi^{(0)}, \phi^{(0)})}{(\phi^{(0)}, \phi^{(0)})} \phi_i^{(0)} = x_i - \frac{(x,1)}{(1,1)} \text{ and}$$

$$\phi_i^{(j+1)} = x_i \phi_i^{(j)} - \frac{(x\phi^{(j)}, \phi^{(j)})}{(\phi^{(j)}, \phi^{(j)})} \phi_i^{(j)} - \frac{(\phi^{(j)}, \phi^{(j)})}{(\phi^{(j-1)}, \phi^{(j-1)})} \phi_i^{(j-1)}.$$

This approach led to a rapid calculation of the polynomial fit, requiring no matrix operations, was free from problems of ill-conditioning, and has been tested to 50th degree ($j=0,\ldots,50$) without significant buildup of roundoff error. Binary weighting was accomplished by omitting from the inner products those terms whose $x_i$ (i.e., current values) fall within the regions of deviation.

Figure 4:
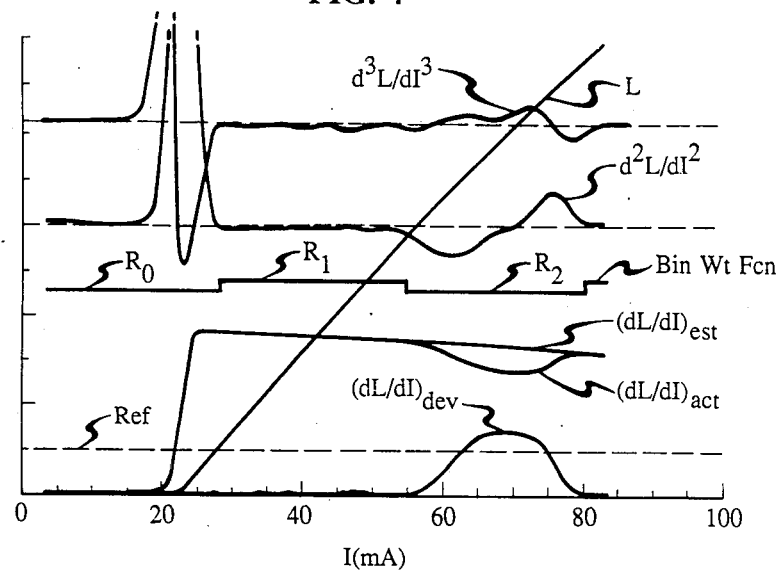
FIG. 4 is a graph of the L-I curve and various derivatives thereof also for the same laser as in FIGS. 2 and 3, but $(dL/dI)_{est}$ is generated by a weighted third order polynomial fit in which the weighting function is identical to that of FIG. 3 except that the anomalous point has been excluded. As a consequence, an excellent fit results.
Figure 5:
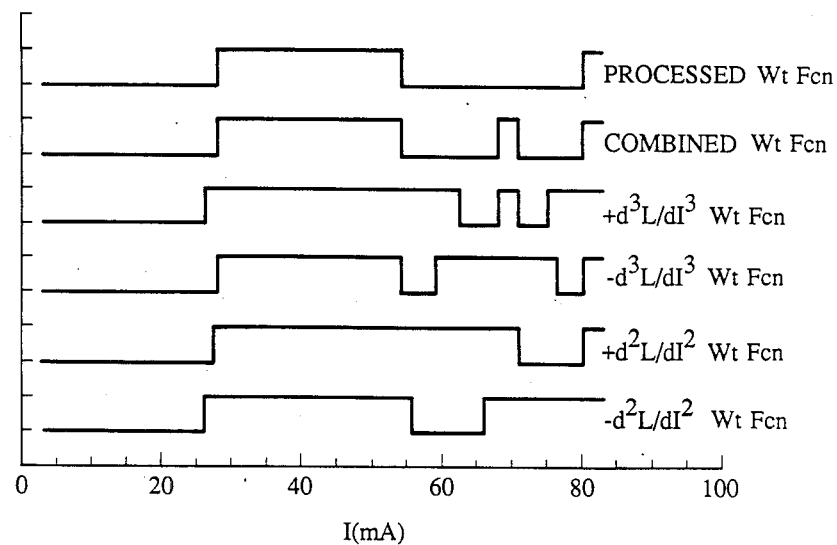
FIG. 5 is a graph showing how the weighting function of FIG. 4 is generated. Positive and negative discriminators are applied to $d^2L/dI^2$ and $d^3L/dI^3$ to generate four weighting functions. The combined weighting function is derived by combining (logical AND) the four together, and the processed weighting function results after the combined weighting function is processed by a pattern recognition technique.

Next, the binary weighting functions (values equal 0 or 1 for each current value $x_i$) were generated. Initially four separate binary weighting functions were generated and then combined (logical AND) forming a single function (see FIG. 5). The four functions were derived by separately testing whether $d^2L/dI^2$ and $d^3L/dI^3$ exceeded a positive discriminator level (resulting in a 0 entry into the positive weighting function for each such value of $x_i$) or lie below a negative discriminator level (resulting in a 0 entry into the negative weighting function for each such value of $x_i$). At currents below and near lasing threshold the weighting function was set to 0. The motivation for using $d^2L/dI^2$ in determining the weighting functions is that its value is largest near (but not throughout) deviations. This is also true of $d^3L/dI^3$, but it tends to "fill in" regions near the edges and just off center of the deviations. This is illustrated in FIGS. 4-5. The four discriminator levels were adaptively determined for each device.

To determine the four adaptive discriminator levels, $d^2L/dI^2$ and $d^3L/dI^3$ data points, taken at currents which somewhat exceed the lasing threshold, were sorted by increasing magnitude. Discriminator levels were set to the values of data points some fraction of the way into the distribution (e.g., 15-20%). For example, if the sorted $d^2L/dI^2$ array contained 100 data points ($i=1,\ldots,100$), and if the chosen fraction is 18%, then the negative discriminator level was set to (sorted $d^2L/dI^2)_{i=18}$. Similarly, the positive discriminator level was set to (sorted $d^2L/dI^2)_{i=82}$. Although the discriminator levels are set adaptively, they should have a preselected minimum value in order for the technique to generate a better fit for devices, which do not have substantial nonlinearities. FIG. 5 illustrates the four weighting functions so derived, as well as the single function derived by combining the four together.

However, FIG. 5 also illustrates that a binary weighting function derived in this way is insufficient, as there may be a number of entries of value 1 (unity) near the center of a dL/dI deviation. These unity entries result from the small amplitudes of $d^2L/dI^2$ and $d^3L/dI^3$ in the center of a deviation (FIG. 4). Since a single anomalous non-zero point adversely affects the fit (see FIG. 3), all such points should be removed. This was accomplished by a pattern recognition technique which identified sequences of ones surrounded on each side by, for example, at least twice as many zeroes (e.g., 00000000111100000000) and replaced these sequences by all zeroes (e.g., 00000000000000000000) as illustrated in FIG. 5. An additional refinement allowed as many as every other 1 to be absent and still found a pattern match (e.g., 00000000110100000000 was also replaced with all zeroes).

The polynomial fit must extrapolate over regions where the weighting function is set to zero. Consequently, the order n of the polynomial should be high enough to enable $(dL/dI)_{est}$ to follow the overall curvature of $(dL/dI)_{act}$ but not so high that spurious structure is introduced in $(dL/dI)_{est}$ in regions where the weighting function equals zero. In practice, in the case of kink and/or light jump detection in semiconductor lasers, n=3 was found to be preferred although other values (e.g., n=4) may be suitable depending upon the type of device and the measurement conditions utilized.

The polynomial fit obtained with the processed binary weighting function was inappropriate for current values below and near lasing threshold. Therefore, $(dL/dI)_{est}$ was set equal to $(dL/dI)_{act}$ for data points starting with the first, up through lasing threshold, continuing until the condition $(dL/dI)_{est} \geq (dL/dI)_{act}$ is met. If this condition was not fulfilled within 12 data points of threshold, then the replacement procedure was terminated at that point. Having determined $(dL/dI)_{est}$, $(dL/dI)_{dev}$ was calculated by subtracting $(dL/dI)_{act}$ from $(dL/dI)_{est}$, taking the absolute value, and normalizing with respect to the peak value of $(dL/dI)_{est}$.

EXAMPLE II

Figure 1:
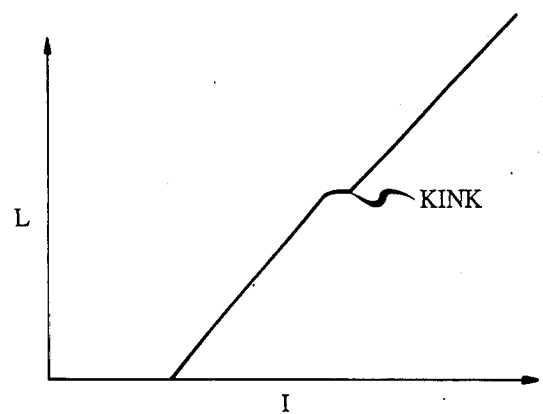
FIG. 1 is a graph showing a kink which is large enough to be identified by a visual inspection of the L-I curve of a semiconductor laser.
Figure 2:
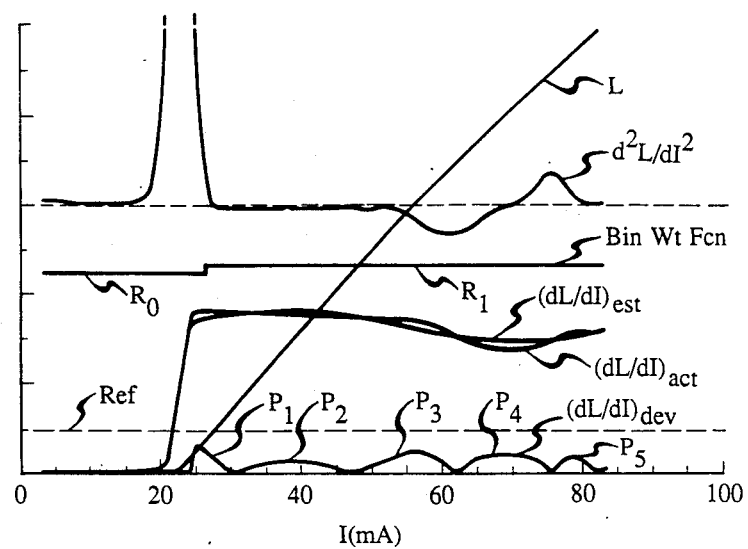
FIG. 2 is a graph of the L-I curve and various derivatives thereof for a laser with a relatively large kink which is not, however, readily identified by a visual inspection of the L-I curve or the actual (measured) first derivative $(dL/dI)_{act}$. This figure also shows that an estimated first derivative, $(dL/dI)_{est}$, generated by a weighted third order polynomial fit in which the weighting function is equal to one for the entire current range just above threshold, causes the deviation function $(dL/dI)_{dev}$ to be distributed throughout a broad current range, thereby failing to identify the location or amplitude of the kink.

The following example illustrates the application of the invention to the identification and quantification of a relatively large kink in a semiconductor diode laser. As shown in FIG. 2, the laser does not exhibit a kink large enough to be readily identified from a visual inspection of the L-I curve; nevertheless, the laser does exhibit a relatively large kink at a current of about 60 mA which should be detected. However, if the binary weighting function, as shown, is equal to zero below the lasing threshold (region $R_0$; so that the system will ignore below-threshold data) and is equal to one for all currents slightly greater than threshold (region $R_1$; so that the system will take into account all data for currents slightly greater than threshold), then a third order (n=3) polynomial fit to the actual first derivative yields an estimated first derivative which has values above and values below the actual function depending upon the particular current. When the two are subtracted from one another, the deviation function $(dL/dI)_{dev}$ is distributed over the entire current range above threshold. The presence of multiple peaks ($P_1$ to $P_5$) in $(dL/dI)_{dev}$ renders it virtually impossible to locate the precise current where the kink occurs. Moreover, the distribution of $(dL/dI)_{dev}$ over so broad a range results, in this case, in a lower maximum deviation such that all of the maxima fall below the illustrative reference level (Ref) defined by the device specification. Consequently, for this laser use of the weighting function of FIG. 2 causes the system to indicate erroneously either that there is no kink at all or that there is no kink which exceeds the device specification.

Figure 3:
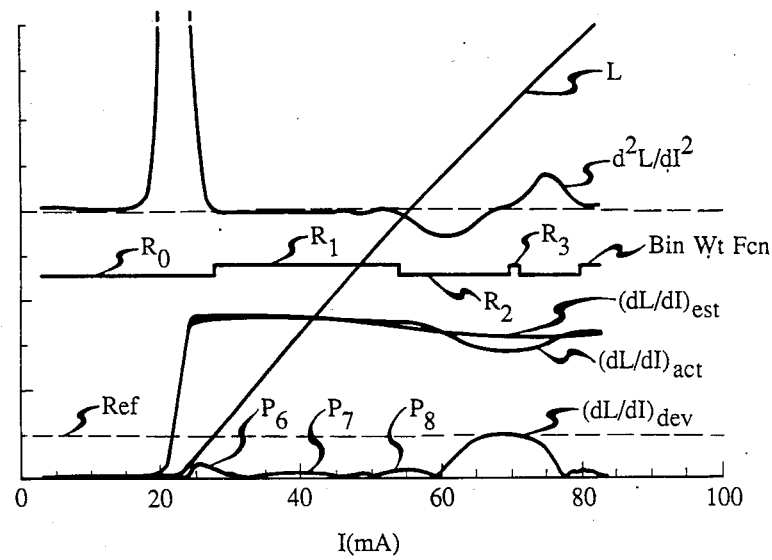
FIG. 3 is a graph of the L-I curve and various derivatives thereof for the same laser as in FIG. 2, but $(dL/dI)_{est}$ is generated by a weighted third order polynomial fit in which the weighting function is equal to one in the current range from just above threshold to about 55 mA and is zero in the range from about 55 to 80 mA where a nonlinearity esists. However, the weighting function also includes one anomalous non-zero point $R_3$ at about 70 mA in the region of the nonlinearity to illustrate the deleterious effect of that anomalous point on the fit.

In contrast, FIG. 3 demonstrates, for the same laser under test in FIG. 2, the use of a binary weighting function which is equal to zero below threshold (region $R_0$), is equal to one in region $R_1$ (essentially from just above threshold to the region $R_2$ where the system determines that a nonlinearity exists), but then is zero in the region $R_2$ in order to eliminate the effects of the nonlinearity in generating $(dL/dI)_{est}$. The fact that the system is able to recognize where the region $R_2$ of potential nonlinearity resides is determined by the application of the adaptive discriminator function to second and third order derivatives of the L-I curve. Importantly, FIG. 3 illustrates that the system has erroneously included one or more ones in the region $R_3$ of the weighting function where the magnitude of each of the higher order derivatives ($d^2L/dI^2$ and $d^3L/dI^3$) is small in the region of the nonlinearity; i.e., in between the discriminator levels for each higher order derivative. The impact of this apparently minor error, however, is enormous. Its effect is to cause a portion ($P_6$ to $P_8$) of the deviation function to have structure outside the region $R_2$ of nonlinearity, thereby lowering the magnitude of the principal peak of $(dL/dI)_{dev}$ which the system has correctly identified exists between about 60 mA and 77 mA. As a consequence, the system will correctly locate the nonlinearity, but notwithstanding that the nonlinearity is relatively large, it will incorrectly determine the size of the nonlinearity. For the illustrative reference level (Ref) shown, the laser would be erroneously indicated as passing specification when in fact it should have failed.

The effect of such anomalous non-zero points in region $R_2$ is alleviated by utilizing the pattern recognition means 18.7 of computing means 18 which, as shown in FIG. 4, eliminates the anomalous points from the binary weighting function. As a result, all of the deviation function has been concentrated in the current range between 55 and 80 mA; there are no spurious regions of this curve outside this range. The actual location of the kink is a matter of definition; for example, one useful definition states that the location of a kink is the first current where $(dL/dI)_{dev}$ exceeds the reference (Ref). In this example, the system has correctly identified and quantified the kink in the laser and can now accurately compare it to the reference level (Ref) to determine that the laser fails to meet specification.

Figure 6:
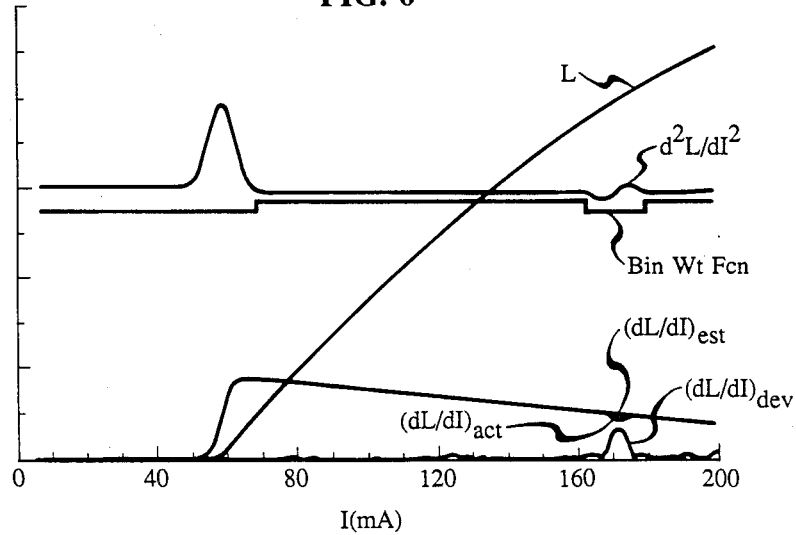
FIG. 6 is a graph of the L-I curve and various derivatives thereof for a laser having a relatively small kink which is hard to detect and/or quantify.

The foregoing example associated with FIGS. 2–5 whose chosen for the purposes of illustration because the kink was relatively large yet the system, if not properly designed in accordance with the invention, would still fail to identify and/or correctly quantify the kink. A more difficult to detect, yet frequently occurring, laser characteristic is shown in FIG. 6. Here, the laser exhibits a relatively small kink at approximately 169 mA which is virtually impossible to detect from the L-I curve and, for a human operator, extremely difficult to detect from the actual first derivative curve. Indeed, experiments performed with human operators given difficult cases of this type clearly indicate a high degree of dependence upon operator judgment and a wide variation in the decisions made by different operators as to both the location and quantification of such a kink. Yet, the invention makes it clear from the deviation function where the kink is located and what its magnitude is.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

What is claimed is:

1. In a method of manufacturing devices, a method of screening the devices to determine which meet a predetermined criterion, comprising the steps of:
   (a) supplying input excitation to a device,
   (b) measuring the output of the device in response to the excitation, the device tending to include a nonlinearity in its output versus excitation characteristic,
   (c) generating the first derivative of the measured output characteristic,
   (d) generating an estimated first derivative of the output characteristic which would be obtained if the device had no nonlinearity,
   (e) comparing the first derivative of the measured output with the estimated first derivative to identify whether the device actually has a nonlinearity, and
   (f) if the device has a nonlinearity, comparing one or more parameters of the nonlinearity with the predetermined criterion to determine whether the device satisfies the criterion.

2. The method of claim 1 wherein the estimated first derivative of step (d) is generated by a weighted polynomial fit to the measured first derivative of step (c).

3. The method of claim 2 wherein the polynomial fit is generated by means of a binary weighting function which is zero in the region of the output characteristic where the nonlinearity is located.

4. The method of claim 3 wherein the binary weighting function is generated by:
generating the second and third derivatives of the output characteristic,
for each device setting discriminator levels from the derivatives,
determining the regions of those derivatives which are large relative to the discriminator levels,
generating a preliminary binary weighting function which is zero in the regions where the second or third derivative is large, the preliminary function tending to have anomalous ones, if any, in those regions, and
applying pattern recognition to the preliminary function to eliminate the anomalous ones and to generate the binary weighting function used to produce the polynomial fit.

5. The method of claim 4 wherein the polynomial fit is generated using an orthogonal set of basis functions.

6. The method of claims 1, 2, 3, 4 or 5 where the device is a semiconductor laser, the excitation is current (I) supplied to the laser, the output is light intensity (L) generated by the laser, and the nonlinearity is selected from the group consisting of kinks and light jumps.

7. The method of claim 6 wherein dc or pulsed input current excitation is applied to the laser, the light output of the laser is applied to a photodetector to generate a photocurrent representative of the light intensity, the input current and the photocurrent are digitized and stored as data in a computing means, and the first derivative of step (c) is generated from the stored data.

8. In the manufacture of devices, apparatus for screening the devices to determine which ones meet a predetermined criterion, comprising:
(a) means for supplying input excitation to a device,
(b) means for measuring the output of the device in response to the excitation, the device tending to include a nonlinearity in its output versus excitation characteristic,
(c) means for generating the first derivative of the measured output characteristic,
(d) means for generating an estimated first derivative of the output characteristic which would be obtained if the device had no nonlinearity,
(e) means for comparing the first derivative of the measured output with the estimated first derivative to identify whether the device actually has a nonlinearity, and
(f) means for comparing one or more parameters of the nonlinearity with the predetermined criterion to determine whether the device satisfies the criterion.

9. The apparatus of claim 8 wherein means (d) for generating the estimated first derivative includes means for generating a weighted polynomial fit to the measured first derivative generated by means (c).

10. The apparatus of claim 9 wherein said means for generating the polynomial fit includes means for generating a binary weighting function which is zero in the region of the output characteristic where the nonlinearity is located.

11. The apparatus of claim 10 wherein said means for generating the binary weighting function includes:
means for generating the second and third derivatives of the output characteristic,
means for setting discriminator levels for each device from the derivatives,
means for determining the regions of those derivatives which are large relative to the discriminator levels,
means for generating a preliminary binary weighting function which is zero in the regions where the second or third derivative is large, the preliminary function tending to have anomalous ones, if any, in those regions, and
means for applying pattern recognition to the preliminary function to eliminate the anomalous ones and to generate the binary weighting function used to produce the polynomial fit.

12. The apparatus of claim 11 wherein said fit generating means includes means for generating an orthogonal set of basis functions from which the fit is determined.

13. The apparatus of claims 8, 9, 10, 11 or 12 where the device comprises a semiconductor laser, the excitation means includes means for supplying current (I) to the laser, the output is light of intensity (L) generated by the laser, and the nonlinearity is selected from the group consisting of kinks and light jumps.

14. The apparatus of claim 13 wherein the excitation means includes means for supplying dc or pulsed input current to the laser, the measuring means includes a photodetector for converting the light output of the laser to a photocurrent representative of the light intensity, means for digitizing the input current and the photocurrent, means for storing the digitized currents as data, and the generating means (c) generates the first derivative of the measured output characteristic from the stored data.

* * * * *